United States Patent
Kang et al.

(10) Patent No.: US 7,388,395 B2
(45) Date of Patent: Jun. 17, 2008

(54) TEST SEMICONDUCTOR DEVICE AND METHOD FOR DETERMINING JOULE HEATING EFFECTS IN SUCH A DEVICE

(75) Inventors: Seung H. Kang, Sinking Spring, PA (US); Subramanian Karthikeyan, Schnecksville, PA (US); Sailesh M. Merchant, Macungie, PA (US)

(73) Assignee: Agere Systems Inc., Allentown, PA (US)

( * ) Notice: Subject to any disclaimer, the term of this patent is extended or adjusted under 35 U.S.C. 154(b) by 278 days.

(21) Appl. No.: 11/403,750

(22) Filed: Apr. 13, 2006

(65) Prior Publication Data

US 2006/0192584 A1    Aug. 31, 2006

Related U.S. Application Data

(62) Division of application No. 10/953,292, filed on Sep. 29, 2004, now Pat. No. 7,061,264.

(51) Int. Cl.
*G01R 31/26* (2006.01)
(52) U.S. Cl. .................................................... 324/765
(58) Field of Classification Search ............ 324/760, 324/765, 158.1, 763; 257/48; 438/14, 18; 219/209, 201
See application file for complete search history.

(56) References Cited

U.S. PATENT DOCUMENTS

| | | | |
|---|---|---|---|
| 5,898,706 A | 4/1999 | Dufresne et al. | |
| 5,902,504 A | 5/1999 | Merchant et al. | |
| 6,066,561 A | 5/2000 | Kumar et al. | |
| 6,094,170 A | 7/2000 | Peng | |
| 6,603,321 B2 | 8/2003 | Filippi, Jr. et al. | |
| 6,605,955 B1 | 8/2003 | Costello et al. | |
| 6,614,003 B2 | 9/2003 | Hembree et al. | |
| 6,710,443 B1* | 3/2004 | Rost et al. ............ | 257/712 |
| 6,744,270 B2 | 6/2004 | Stone | |
| 6,770,847 B2* | 8/2004 | Yao et al. ............ | 219/209 |
| 2004/0070078 A1 | 4/2004 | Ho et al. | |

* cited by examiner

*Primary Examiner*—Ha Nguyen
*Assistant Examiner*—Tung X Nguyen

(57) ABSTRACT

Method and test structures for determining heating effects in a test semiconductor device (10) are provided. The test device may include a first conductive metal structure ($15_1$-$15_6$) for accepting a flow of electric current that causes a heating effect. The test device may further include a second conductive metal structure proximate ($12_1$-$12_6$) the first conductive structure for obtaining resistivity changes in response to the heating effect. The resistivity changes are indicative of temperature changes due to the heating effect.

6 Claims, 8 Drawing Sheets

TEST SEMICONDUCTOR DEVICE AND METHOD FOR DETERMINING JOULE HEATING EFFECTS IN SUCH A DEVICE

RELATED APPLICATION DATA

The application is a DIV of Ser. No. 10/953,292 filed on Sep. 29, 2004, now U.S. Pat. No 7,061,264.

FIELD OF THE INVENTION

The present invention is generally related to semiconductor devices, and, more particularly, to a test semiconductor device and method for determining Joule heating effects in the semiconductor device.

BACKGROUND OF THE INVENTION

By way of background, "Joule heating" results from a current flow encountering resistance in an electrically conductive structure, such as a metal interconnect line in a semiconductor device. As a result of heat caused by Joule heating, the performance of the semiconductor device can be adversely affected. For example, Joule heating could lead to severe interconnect electromigration and/or stress-induced void malfunctions of the semiconductor device.

One approach that has been tried for reducing such malfunctions involves limiting certain operational conditions of the semiconductor device so that such a device is likely to meet specified reliability requirements. For example, one may a priori impose direct current (DC) limits on DC current carrying interconnects to reduce electromigration.

It has been observed that in operational semiconductor devices significant Joule heating can occur due to alternating current (AC) signals that, for example, may be present in the proximity of DC current carrying interconnects, with concomitant large temperature increases in their immediate vicinity. This highly localized temperature increase can affect the operational reliability of the interconnect lines and lead to unforeseen malfunctions. These temperature increases can be well above the device operating range and lead to an unacceptable number of reliability failures and a reduced lifetime. Moreover, these local temperature changes can affect the interconnect stress state, thus altering the electromechanical reliability of the device.

Some known techniques that have been attempted for determining Joule heating effects in wafers or semiconductor devices include the following:

(a) Techniques based on a Temperature Coefficient of Resistance (TCR) estimation for the interconnect lines and temperature estimation under thermal equilibrium conditions. However, instabilities and/or non-uniformities across the wafer may lead to inaccurate temperature estimates for interconnect lines at sub-micron levels, as may be the case in a semiconductor device that comprises a plurality of layers.

(b) Techniques based on infra-red (IR) temperature sensing devices. In practice, however, IR sensing may be somewhat limited since generally just the exposed surface of the die or package is visible to the IR sensing device. Thus, this technique may not offer an accurate estimate of interconnect temperatures at lower layers of a multi-layer semiconductor device.

(c) Stress measurement techniques using thin films deposited on blanket wafers. This technique of stress measurements using blanket wafers, however, may not accurately replicate true stress scenarios in a patterned semiconductor chip or wafer. Moreover, stress measurement techniques using micro-x-ray grid patterns on relatively large area designs (e.g., $mm^2$ size) are not desirable since stress conditions can vary significantly as a function of temperature and Joule heating, thus affecting the ability to obtain an accurate knowledge of interconnect reliability.

In view of the foregoing considerations, it would be desirable to provide test structures in a test semiconductor device that allow for accurately and consistently determining Joule heating effects, and attendant reliability implications for a class of semiconductor devices built like the test semiconductor device. It is also desirable to provide techniques for performing accurate interconnect temperature measurements that can lead to a more thorough understanding of the true operational capabilities of a semiconductor device.

BRIEF DESCRIPTION OF THE DRAWINGS

These and other advantages of the invention will be more apparent from the following description in view of the drawings that show.

DETAILED DESCRIPTION OF THE INVENTION

The inventors of the present invention have recognized innovative interconnect-based test structures that can be fabricated within a test semiconductor device where Joule heating effects need to be understood. In one aspect of the present invention, an exemplary technique for temperature determination evaluates local temperature changes that can occur at electrically conductive test interconnects disposed in relatively close proximity to electrically conductive operational interconnects, such as runners or stacked via chains, that normally carry electrical current while the device is in operation and thus cause Joule heating. That is, a flow of current established in an electrically conductive operational interconnect causes Joule heating that affects the resistive properties of a test interconnect disposed proximate to the operational interconnect.

It will be appreciated that the functional test roles of a test interconnect and an operational interconnect can be optionally reversed. That is, the flow of electrical current could be established in the test interconnect and this would cause a Joule heating effect that in this case would affect the resistive properties of the operational interconnect disposed proximate to the test interconnect. It will be further appreciated that the present invention in its broadest aspects does not require any operational interconnect lines for determining Joule heating effects in a test semiconductor device or wafer since such effects may be effectively determined by placing a first conductor structure (e.g., where a current flow is established) proximate a second conductor structure; and measuring resistivity changes (which would be indicative of temperature changes due to Joule heating) in that second conductor structure.

Assuming electrical current flow is established in an operational interconnect, the induced temperature changes can be accurately determined at the test interconnect proximate the operational interconnect by measuring resistivity (i.e., resistance) changes in such test interconnect and comparing these resistance changes relative to a predetermined baseline set of resistance values (as may be experimentally and/or analytically derived) for the test interconnect. It should be appreciated that the foregoing technique for determining Joule heating does not rely on the estimation of a temperature coefficient of resistance (TCR), which is believed to be a marginal technique for accurate determination of temperature in a multi-layer semiconductor device.

The invention will be described with a series of exemplary conductive test interconnect structures that can be utilized in combination with conductive operational interconnects (or other conductive test structures) to determine Joule heating effects in a semiconductor device. FIGS. 1-8 show various arrangements of exemplary test interconnect structures that can be used for temperature determination in a multi-layer semiconductor device.

Figure 2:
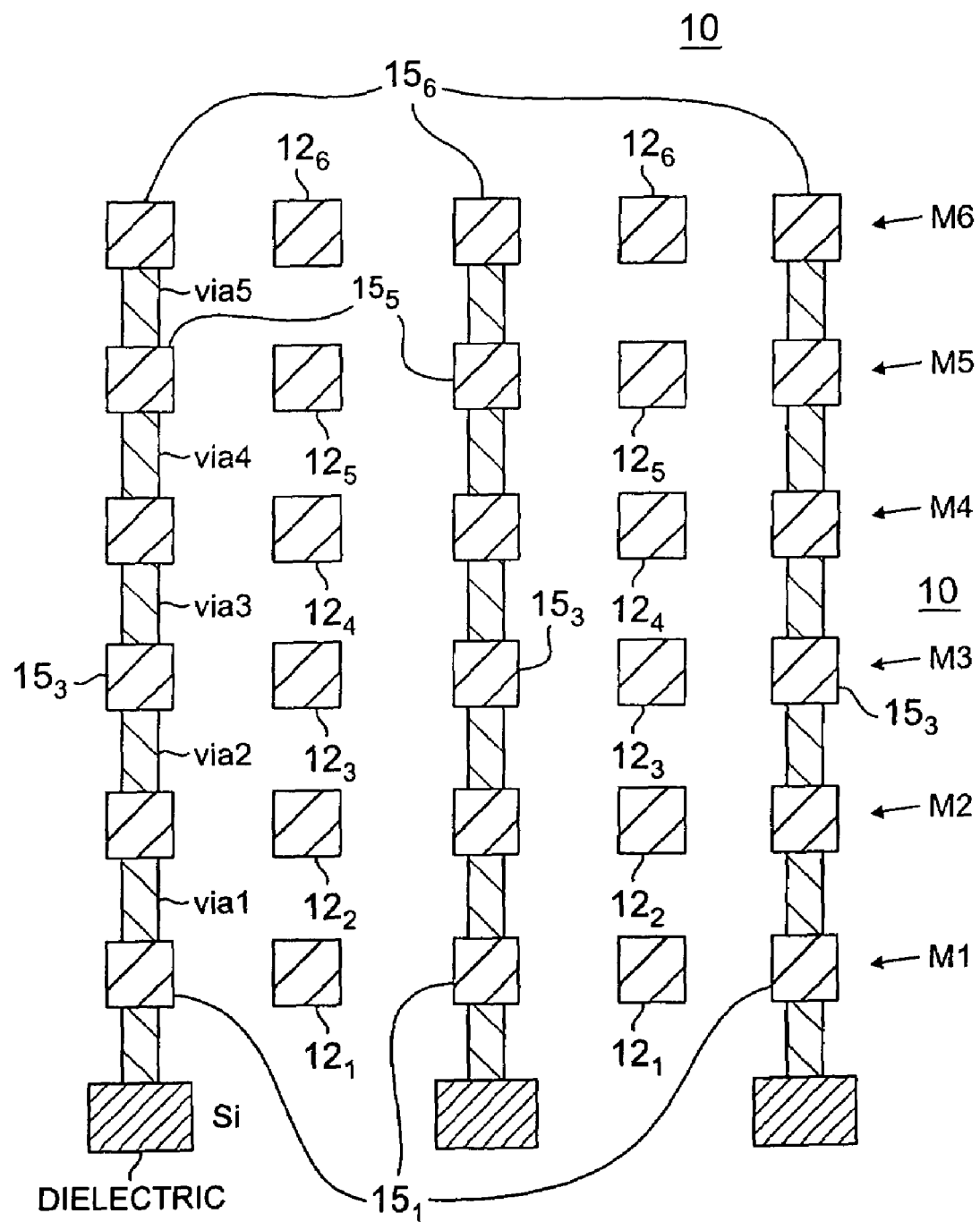
FIG. 2 is cross-sectional view of the exemplary embodiment of FIG. 1.

FIG. 2 illustrates a semiconductor device 10 comprising a plurality of layers including metal levels (e.g., metal levels M1-M6) that may be interconnected to one another by way of a chain of stacked vias, such as via1-via5. It will be understood that the present invention is not limited to the foregoing number of levels since such levels just comprise one example and higher or fewer number of levels can be readily accommodated by the techniques of the present invention.

Figure 1:
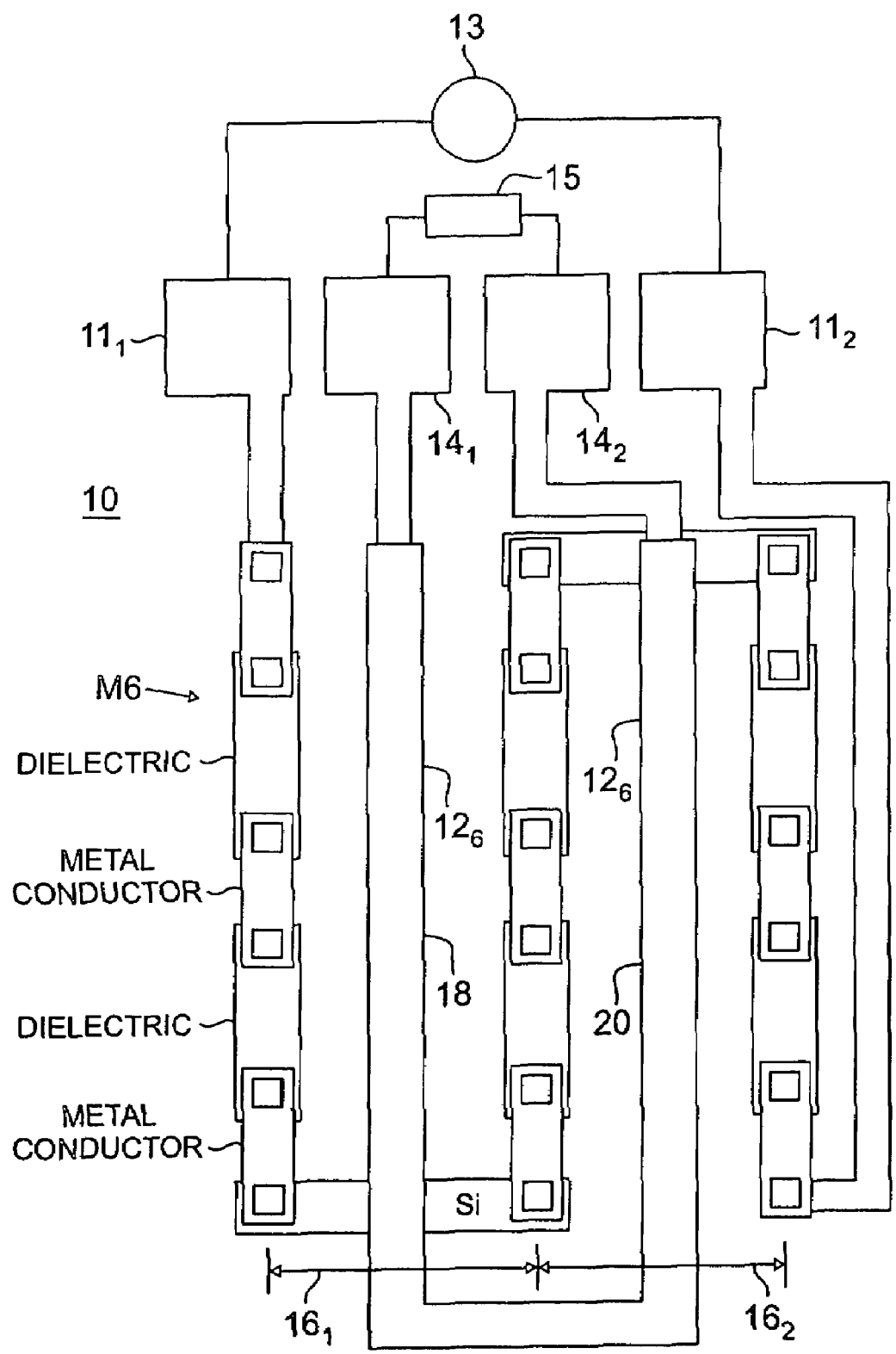
FIG. 1 is a top view of a first exemplary embodiment of test interconnect structures for determining temperature effects in a test semiconductor device.

FIG. 1 is a top view of the top-most metal level of semiconductor device 10, e.g., metal level M6, while FIG. 2 is a cross-sectional view of the device 10. FIG. 1 shows a first interface pad $11_1$ electrically connected to interconnect lines respectively disposed at metal levels M1-M6 by way of the stacked vias, e.g., via1-via5 seen in FIG. 2, and in turn electrically connected to a second interface pad $11_2$. For example, a suitable test electrical source 13, such as an AC source may be connected across pads $11_1$ and $11_2$ to establish a flow of electrical current therebetween. The AC source 13 may be controlled by a controller (not shown) to provide a desired level of electrical power based on parameters such as amperage, frequency and/or a duty cycle of the AC current. For example, the controller may control the AC source 13 to produce an AC current having an amperage and frequency sufficiently close to mimic an amperage and frequency of an AC signal that an operational interconnect line may be subjected to when used in a semiconductor circuit design. In another aspect of the invention, the AC source 13 may be cycled on and off in a desired duty cycle to expose the operational interconnects to thermal cycling to for example, simulate a time-varying thermal cycle that the operational interconnects may be subjected to when used in a semiconductor circuit design.

FIG. 2 further shows a plurality of conductive test structures $12_1$-$12_6$ that may be used for determining temperature based on resistance changes experienced by such test structures in response to Joule heating caused by the current flow in the operational interconnects. Each of the test interconnect structures (e.g., test interconnect $12_6$) may be respectively disposed at a respective metal level to be co-planarly adjacent the operational interconnect lines (e.g., interconnect lines $15_6$) situated at that same level. For example, as seen in FIG. 1, test interconnect $12_6$ is electrically connected to interface pads $14_1$ and $14_2$ and is disposed proximate the interconnect lines disposed at metal level M6. In operation, heating due to current flow established by the AC source across interface pads $11_1$ and $11_2$ would cause a change in the resistance of test interconnect $12_6$ that may be monitored by a measuring instrument, e.g., an ohmmeter or any other suitable test instrumentation device, connected across interface pads $14_1$ and $14_2$.

As stated above, the measured resistance changes may be compared to a predetermined set of baseline resistance values to obtain an indication of temperature changes due to Joule heating effects. It will be appreciated that the foregoing technique for determining Joule heating effects described in the context of metal level M6 may be individually performed for each of the interconnect line structures disposed at any given level of the semiconductor device in combination with the respective test structures disposed at each of such levels. For example, test interconnect structure $12_3$ may be connected to a respective ohmmeter via respective interface pads to detect temperature changes due to current flow in the adjacent operational interconnect lines (e.g., interconnect lines $15_3$ situated at level M3.

The exemplary test arrangement shown in FIGS. 1 and 2 may be used when the spacing, such as may be represented by lines $16_1$ and $16_2$, between adjacent operational interconnect lines is sufficiently wide to enable the test structure to meander relative to such operational interconnect lines so as to provide an overlapping arrangement relative to the respective interconnect lines in a given metal level. For example, in FIG. 1 one can see that a first leg 18 of test structure $12_6$ is sandwiched between mutually opposite operational interconnect lines. Also, a second leg 20 of test structure $12_6$ is similarly sandwiched between opposite operational interconnect lines.

Figure 3:
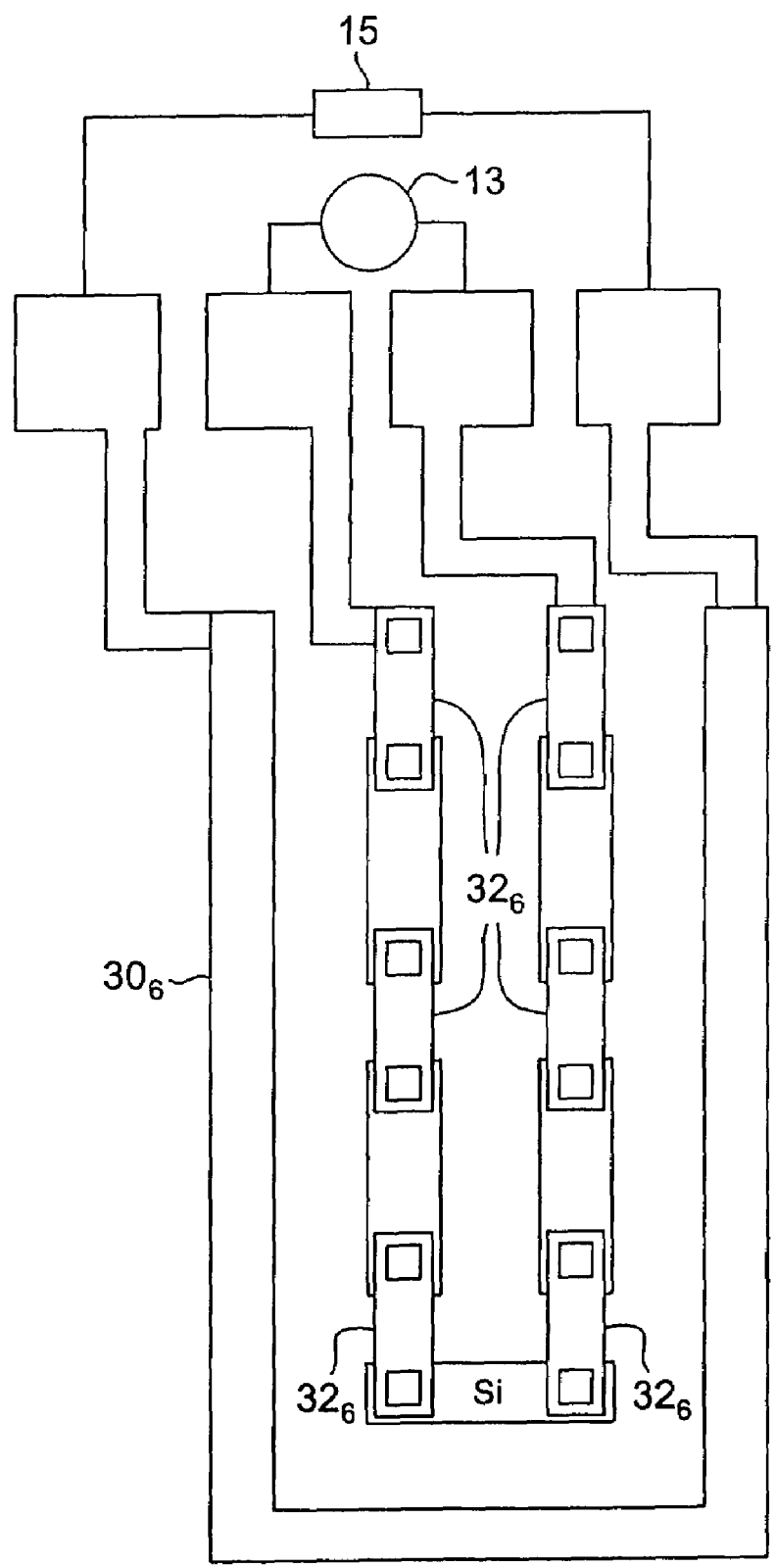
FIG. 3 is a top view of a second exemplary embodiment of test structures for determining temperature effects in a semiconductor device.
Figure 4:
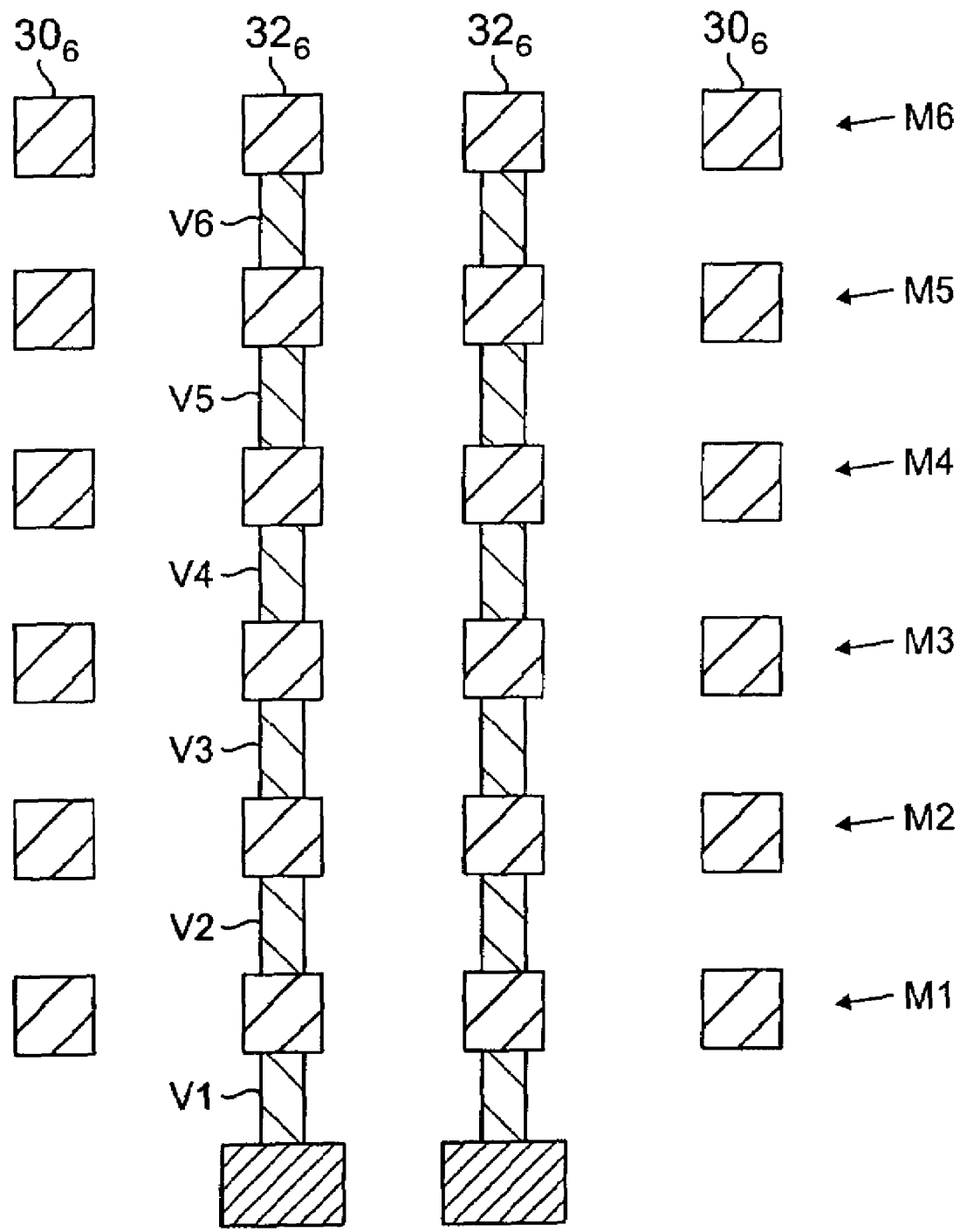
FIG. 4 is cross-sectional view of the exemplary embodiment of FIG. 3.

FIG. 3 is a top view of a second exemplary embodiment of test structures for determining temperature effects in a semiconductor device and FIG. 4 is a cross-sectional view of the device shown in FIG. 3. These figures jointly illustrate an exemplary arrangement wherein each test interconnect structure, such as interconnect structure $30_6$ at metal level M6, substantially circumscribes the operational interconnect lines in that level, such as interconnect lines $32_6$. The details for determining Joule heating are essentially as described in the context of FIGS. 1 and 2, and for the sake of avoiding unnecessary redundancy, such details will not be repeated here.

Figure 5:
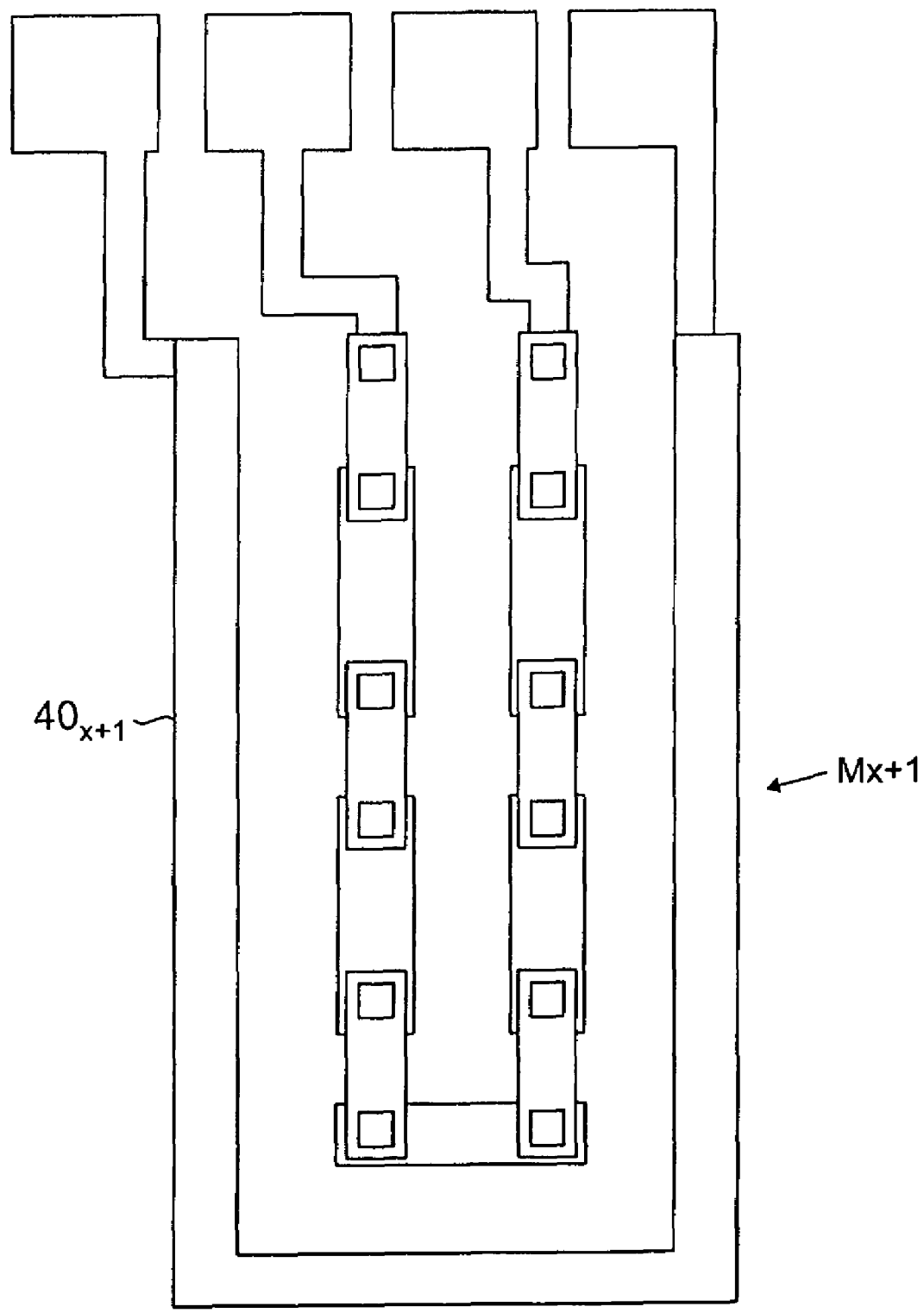
FIG. 5 is a top view of a third exemplary embodiment of test interconnect structures for determining temperature effects in a semiconductor device.
Figure 6:
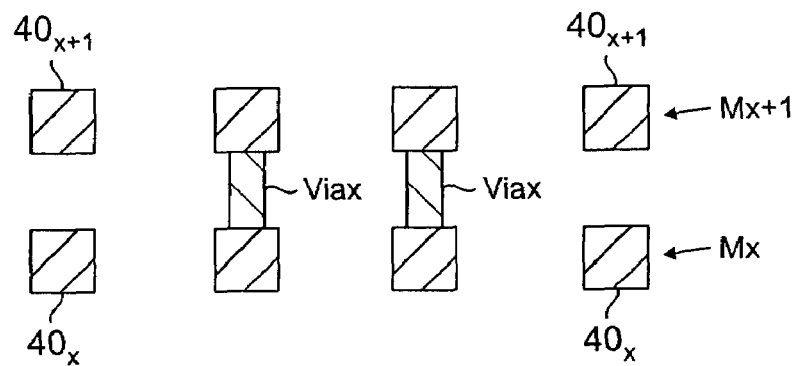
FIG. 6 is cross-sectional view of the exemplary embodiment of FIG. 5.

FIG. 5 is a top view of a third exemplary embodiment of test structures for determining temperature effects in a semiconductor device and FIG. 6 is a cross-sectional view of the device shown in FIG. 5. These figures jointly illustrate an exemplary embodiment of a semiconductor device comprising a 1-level via chain for electrically connecting interconnect lines in a first metal level (e.g., level MX+1) to interconnect lines in a second metal level (e.g., level MX).

A respective test interconnect structure (e.g., test interconnect structure $40_{X+1}$) is disposed proximate to the interconnect lines at that metal level. Similarly, test interconnect structure $40_X$ is disposed at level MX proximate to the interconnect lines at that level. The foregoing arrangement may be duplicated at each metal level in a multi-level semiconductor device or wafer.

Figure 8:
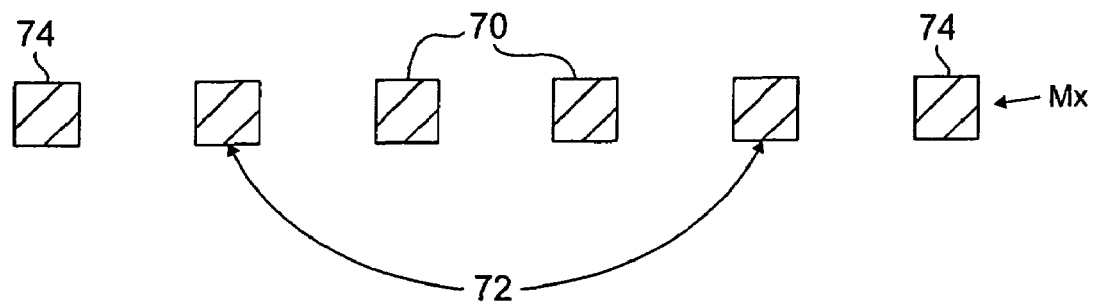
FIG. 8 is cross-sectional view of the exemplary embodiment of FIG. 7.
Figure 7:
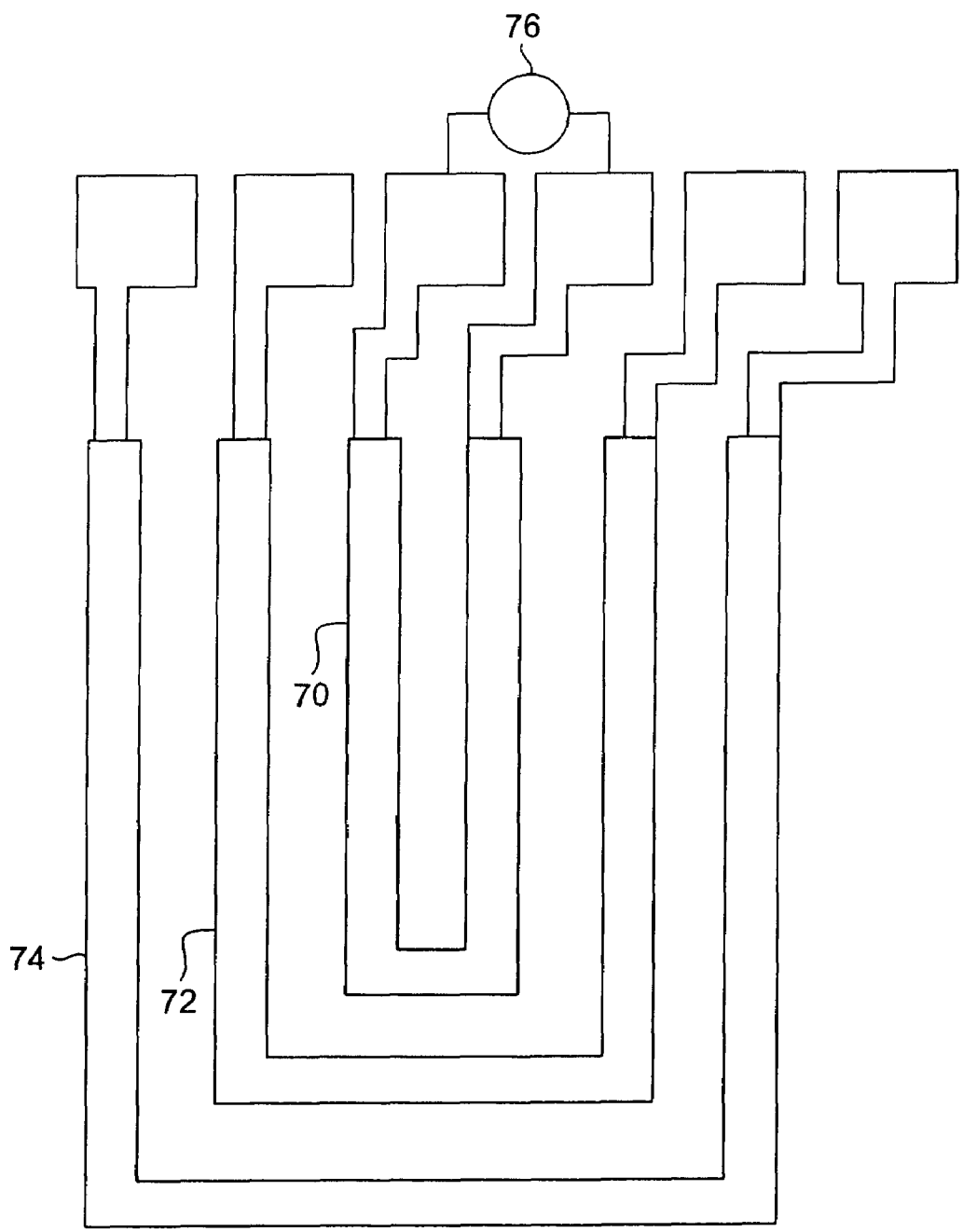
FIG. 7 is a top view of a fourth exemplary embodiment of test interconnect structures for determining temperature effects in a semiconductor device.

FIG. 7 is a top view of a third exemplary embodiment of test structures for determining temperature effects in a semiconductor device and FIG. 8 is a cross-sectional view of the device shown in FIG. 7. These figures jointly illustrate an exemplary embodiment wherein each metal level includes at least two or more nested test interconnect lines, such as test lines 70, 72 and 74. For example, an AC source 76 may be connected to establish current flow at test interconnect line 70. A suitable instrumentation device may be respectively connected across test interconnect line 72 and/or across test interconnect line 74 to measure respective resistivity changes indicative of temperature changes due to Joule heating. The foregoing arrangement may be duplicated at each level of a multi-level semiconductor device or wafer. It will be understood that the AC source need not be connected to test line 70 since any of the other test lines in that level can be used for carrying an AC current flow that would cause a heating effect affecting the resistivity of a neighboring test line, and, consequently providing an indication of temperature changes in response to such heating effect.

It should be evident from the foregoing description and exemplary embodiments that the test interconnect structures embodying aspects of the present invention for determining Joule heating effects in a multi-level semiconductor device or wafer may be readily adapted to a variety of interconnect line topologies.

Figure 9:
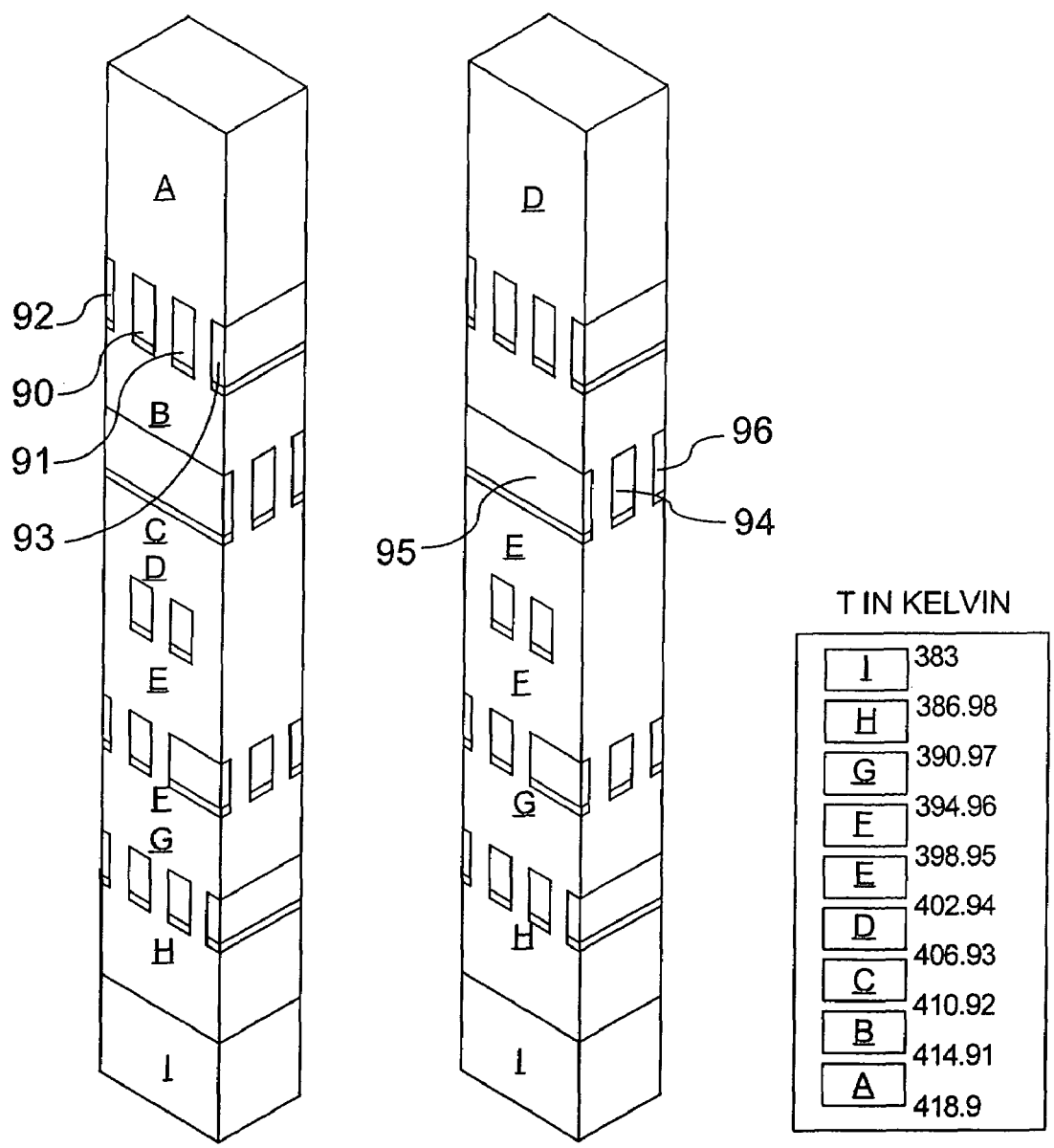
FIG. 9 is a plot based on a finite-element analysis simulation for two exemplary scenarios for determining Joule heating effects in a semiconductor device.

FIG. 9 is a plot based on finite-element analysis simulation for two exemplary scenarios for determining Joule heating effects in a semiconductor device. The simulation exemplarily assumes interconnect conductive lines (e.g., simulated by resistors) spaced apart from one another at a distance of 0.24 um. The simulation further assumes a semiconductor chip operating temperature of 110(° C.) (383 K). In both scenarios, the resistors carry an exemplary AC current (RMS) of 2.16 mA. In the first case, resistors 90 and 91 carry the AC current. The temperature for adjacent resistors, 92 and 93, is determined to be within 0.4(° C.) of resistors 90 and 91, as listed in Table 1. In the second scenario, resistor 94 carries the current and adjacent resistors 95 and 96 are within 0.7 C of resistor 94, as listed in Table 2.

TABLE 1

| | Resistor | | | |
|---|---|---|---|---|
| | 92 | 90 | 91 | 93 |
| T (° C.) | 145.5 | 145.9 | 145.9 | 145.5 |

TABLE 2

| | Resistor | | |
|---|---|---|---|
| | 95 | 94 | 96 |
| T (° C.) | 130.7 | 131.0 | 130.7 |

While the preferred embodiments of the present invention have been shown and described herein, it will be obvious that such embodiments are provided by way of example only. Numerous variations, changes and substitutions will occur to those of skill in the art without departing from the invention herein. Accordingly, it is intended that the invention be limited only by the spirit and scope of the appended claims.

We claim as our invention:

1. A method for determining heating effects in a multi-level semiconductor device, said method comprising:
   providing a first conductive metal structure for accepting a flow of electric current that causes a heating effect;
   providing a second conductive metal structure proximate to said first conductive structure, said second conductive metal structure exhibiting resistivity changes in response to said heating effect;
   comparing said resistivity changes relative to a baseline of resistivity values for said second conductive metal structure; and
   based on the results of said comparison, determining temperature changes in response to said heating effect at a location corresponding to said second conductive metal structure.

2. The method of claim 1 wherein said step of providing a first conductive metal structure for accepting a flow of electric current comprises providing said first conductive structure at each level of said multi-level device.

3. The method of claim 1 wherein said step of providing a second conductive metal structure for providing an indication of resistivity changes comprises providing said second conductive metal structure at each level of said multi-level device.

4. The method of claim 1 wherein said flow of electric current comprises alternating current (AC).

5. The method of claim 4 further comprising controlling said AC current to have an amperage and frequency sufficiently close to emulate an amperage and frequency of an AC signal that an operational interconnect line may be subjected to when used in a semiconductor circuit design.

6. The method of claim 5 further comprising controlling said flow of AC current to be cycled on and off with a desired duty cycle to emulate a time-varying thermal cycle that an operational interconnect may be subjected to when used in a semiconductor circuit design.

* * * * *